United States Patent
Hildebrant et al.

(10) Patent No.: US 6,873,206 B1
(45) Date of Patent: Mar. 29, 2005

(54) CHARGE AMPLIFIER DEVICE HAVING FULLY INTEGRATED DC STABILIZATION

(75) Inventors: Eric M. Hildebrant, Watertown, MA (US); Paul A. Ward, Roslindale, MA (US); Robert A. Bousquet, Somerville, MA (US); Shida Iep Martinez, Andover, MA (US); Harold Ralph Haley, Reading, MA (US)

(73) Assignee: Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 09/839,184

(22) Filed: Apr. 19, 2001

(51) Int. Cl.[7] ................................................ G06G 7/26
(52) U.S. Cl. ...................... 327/560; 327/561; 327/563; 330/253; 330/259; 330/260
(58) Field of Search ........................ 327/108–112, 379, 327/560–563, 551, 552; 330/252, 253, 259, 260, 291–294

(56) References Cited

U.S. PATENT DOCUMENTS

| 4,257,006 A | * | 3/1981 | Schaumann | 327/552 |
| 5,138,279 A | * | 8/1992 | Kondo et al. | 330/294 |
| 5,708,376 A | * | 1/1998 | Ikeda | 327/337 |
| 5,952,885 A | * | 9/1999 | Wu et al. | 330/294 |

* cited by examiner

Primary Examiner—Kenneth B. Wells
(74) Attorney, Agent, or Firm—McDermott Will & Emery LLP

(57) ABSTRACT

A fully integrated charge amplifier with DC stabilization includes a first amplifier having an input terminal and an output terminal, a first capacitor coupled between the input terminal and the output terminal of the first amplifier, a transimpedance amplifier having an input terminal coupled to the output terminal of the first amplifier and an output terminal, and an impedance device coupled between the input terminal of the first amplifier and the output terminal of the second amplifier. The impedance device has a resistance of at least 1 MΩ.

41 Claims, 2 Drawing Sheets

CHARGE AMPLIFIER DEVICE HAVING FULLY INTEGRATED DC STABILIZATION

FIELD OF THE INVENTION

The present invention relates generally to a charge amplifier device having fully integrated DC stabilization and more particularly to a charge amplifier having a DC stabilization device coupled in parallel therewith, wherein the DC stabilization device includes a pair of oppositely-biased diode-configured MOSFETs connected in parallel.

BACKGROUND OF THE INVENTION

Charge amplifiers are used in a number of electronic devices in which very small charges must be detected and amplified, including photodetectors, CCD imaging devices, fiber optic receivers, accelerometers and virtually all Micro-Electro-Mechanical Systems (MEMS). An ideal charge amplifier 10 is shown in FIG. 1. Charge amplifier 10 includes a high-gain operational amplifier ("opamp") A having a non-inverting input terminal 12, an inverting input terminal 14 and an output terminal 16. A feedback capacitor $C_f$ is connected between the inverting input terminal 14 and the output terminal 16. The transfer function of charge amplifier 10 is:

$$\frac{V_{out}}{Q_{in}} = \frac{-1}{C_f}. \quad \text{Eq.(1)}$$

Also, $$\frac{V_{out}}{I_{in}} = \frac{-1}{sC_f}. \quad \text{Eq.(2)}$$

In an ideal environment, the charge amplifier 10 is used to measure a charge $Q_{in}$ at input terminal 14 which is alternating in polarity, such that the average value of the output $V_{out}$ at output terminal 16 is 0V. Such an ideal output value would prevent opamp A from saturating. However, in a typical operating environment, the opamp 10 has an input leakage current which acts as a constant $I_{in}$ and causes the output terminal $V_{out}$ of the charge amplifier 10 to drift toward the supply rail and, as a result, to saturate.

In order to prevent the saturation of the charge amplifier by minimizing or eliminating the input leakage current, a DC conductive parallel path must be present across the capacitor $C_f$. A simple prior art method for providing this path is to connect a high value resistor $R_f$ in parallel with capacitor $C_f$, as shown in the charge amplifier 20 of FIG. 2. The transfer function of the charge amplifier 20 is:

$$\frac{V_{out}}{I_{in}} = \frac{-R_f}{sC_f R_f + 1}. \quad \text{Eq.(3)}$$

When $I_{in}$ is of a sufficiently high frequency such that $sC_f R_f \gg 1$, $$\frac{V_{out}}{I_{in}} = \frac{-1}{sC_f} \quad \text{Eq.(4)}$$

which approximates the transfer function (Eq. (2)) of charge amplifier 10 of FIG. 1. However, in order for this approximation to be valid at lower input frequencies, i.e. 10–100 kHz, the value of the resistance $R_f$ must be in the range of 10–1000 MΩ. For example, for an input frequency of 20 kHz and $C_f$=2pF, the resistance $R_f$ must have a value of 200 MΩ to enable the charge amplifier 20 to approximate the ideal transfer function for charge amplifier 10 shown in Eq. 2. Such high resistance values are not compatible with current CMOS integrated circuit manufacturing processes. Therefore, in order to construct such a charge amplifier, a large, external, discrete resistor must be used, resulting in greater cost, volume and weight of the charge amplifier, as well as increased output noise of the charge amplifier due to the added stray capacitance and thermal noise associated with the external resistor.

Another prior art method of minimizing the input leakage current involves connecting a MOS transistor which is configured as a switch in parallel with capacitor $C_f$. The MOS switch is periodically conducted at a low duty cycle rate, which enables the charge amplifier to obtain the transfer function of Eq. 2 for the periods of time that the MOS switch is open. However, when the switch is closed, the output of the charge amplifier goes to zero. While this system is fully integratable, it does not allow continuous time signal processing, and thus portions of the $Q_{in}$ signal are lost.

Another prior art method of minimizing the input leakage current involves connecting a MOS transistor which is configured as a diode, with its gate connected to its drain, in parallel with capacitor $C_f$. This diode operates to conduct the leakage current and presents a very large resistance to the charge amplifier. However, such a diode configuration causes large (on the order of 1V) and varying DC voltages to be present at the output of the charge amplifier. Furthermore, the extremely large transistor resistance may result in excessive sensitivity to a very low frequency charge, resulting in an acceleration-sensitive charge amplifier.

Yet another method of minimizing the input leakage current involves connecting an operational trans-impedance amplifier ("OTA") in parallel with the capacitor $C_f$, as shown in charge amplifier 30 in FIG. 3. Charge amplifier 30 includes OTA B having a non-inverting input terminal 32 connected to the output terminal 16 of opamp A and an inverting input terminal 34 connected to ground. The output terminal 36 is connected to the inverting input terminal 14 of opamp A. The OTA B is a MOSFET device having a transfer function:

$$I_{out} = g_m[(V_{in}-)] \quad \text{Eq. (5).}$$

In operation, the OTA B outputs the leakage current necessary to servo the output of opamp A to zero volts. In the case of charge amplifier 30, the transconductance $g_m$ must be sufficiently small such that the reactance of capacitor $C_f$ will dominate at the input signal frequency. This device suffers from the addition of noise to the output due to the active components of the OTA B. Furthermore, as is typical for all OTA's, when the required low transconductances are synthesized, a relatively large input offset voltage results due to transistor mismatch and leakage.

Accordingly, the prior art attempts to stabilize DC voltage and minimize the input leakage current in a charge amplifier are not fully integratable and therefore suffer from increased size, cost and volume, increase the noise and offset voltage in the amplifier and/or cannot process input signals in continuous time.

SUMMARY OF THE INVENTION

The present invention is directed to a charge amplifier having a fully integrated DC stabilization device. As described in greater detail below, the invention includes a DC feedback path which minimizes the input leakage current in the charge amplifier, adds very little noise to the system, causes much less output offset voltage compared to the prior art and allows the charge amplifier to process the input signal in continuous time.

According to one aspect of the invention, an integrated circuit includes a first amplifier having an input terminal and an output terminal, a first capacitor coupled between the input terminal and the output terminal of the first amplifier, a second amplifier, which may be a transimpedance amplifier, having an input terminal coupled to the output terminal of the first amplifier and an output terminal and an impedance device coupled between the input terminal of the first amplifier and the output terminal of the second amplifier, the impedance device having a resistance of at least 1MΩ.

The impedance device may include first and second diodes connected in parallel between the input terminal of the first amplifier and the output terminal of the second amplifier and the first and second diodes may be oppositely biased. The first diode may include a first transistor configured as a diode and the second diode may include a second transistor configured as a diode. The first and second transistors may be one of FET and bipolar transistors. The integrated circuit may further include a second capacitor coupled between the input terminal of the second amplifier and the output terminal of the second amplifier and a third capacitor coupled between the output terminal of the second amplifier and a ground terminal.

According to another aspect of the invention, an integrated circuit includes a first amplifier having an input terminal and an output terminal, a first capacitor coupled between the input terminal and the output terminal of the first amplifier, a second amplifier having an input terminal coupled to the output terminal of the first amplifier and an output terminal and a DC stabilization device coupled between the input terminal of the first amplifier and the output terminal of the second amplifier.

The DC stabilization device may include an impedance device having a resistance of at least 1MΩ. The impedance device may include first and second diodes connected in parallel between the input terminal of the first amplifier and the output terminal of the second amplifier. The first and second diodes may be oppositely biased. The first diode may include a first transistor configured as a diode and the second diode comprises a second transistor configured as a diode and the first and second transistors may be one of FET and bipolar transistors. The integrated circuit may further include a second capacitor coupled between the input terminal of the second amplifier and the output terminal of the second amplifier and a third capacitor coupled between the output terminal of the second amplifier and a ground terminal.

According to yet another aspect of the invention, an integrated circuit includes a first amplifier constructed on a chip, the first amplifier having an input terminal and an output terminal, a first capacitor constructed on the chip, the first capacitor being coupled between the input terminal and the output terminal of the first amplifier and a DC stabilization device constructed on the chip, the DC stabilization device being coupled between the input terminal of the first amplifier and the output terminal of the first amplifier and having a resistance of at least 1 MΩ.

The DC stabilization device may include a second amplifier and an impedance device, the second amplifier having an input terminal connected to the output terminal of the first amplifier and an output terminal, wherein the impedance device is coupled between the output terminal of the second amplifier and the input terminal of the first amplifier.

The impedance device may be coupled to the output terminal of the first amplifier through a second amplifier, the second amplifier having an input terminal connected to the output terminal of the first amplifier and an output terminal connected to the impedance device. The impedance device may include a parallel connection of first and second oppositely biased diodes. The first and second diodes each may include a transistor configured as a diode. The transistor that comprises each of the first and second diodes may be formed from one of FET and bipolar junction transistor technology. The integrated circuit may further include a second capacitor coupled between the input terminal of the second amplifier and the output terminal of the second amplifier and a third capacitor coupled between the output terminal of the second amplifier and a ground terminal.

BRIEF DESCRIPTION OF THE DRAWINGS

The foregoing and other objects of this invention, the various features thereof, as well as the invention itself may be more fully understood from the following description when read together with the accompanying drawings in which.

DETAILED DESCRIPTION

Figure 4:
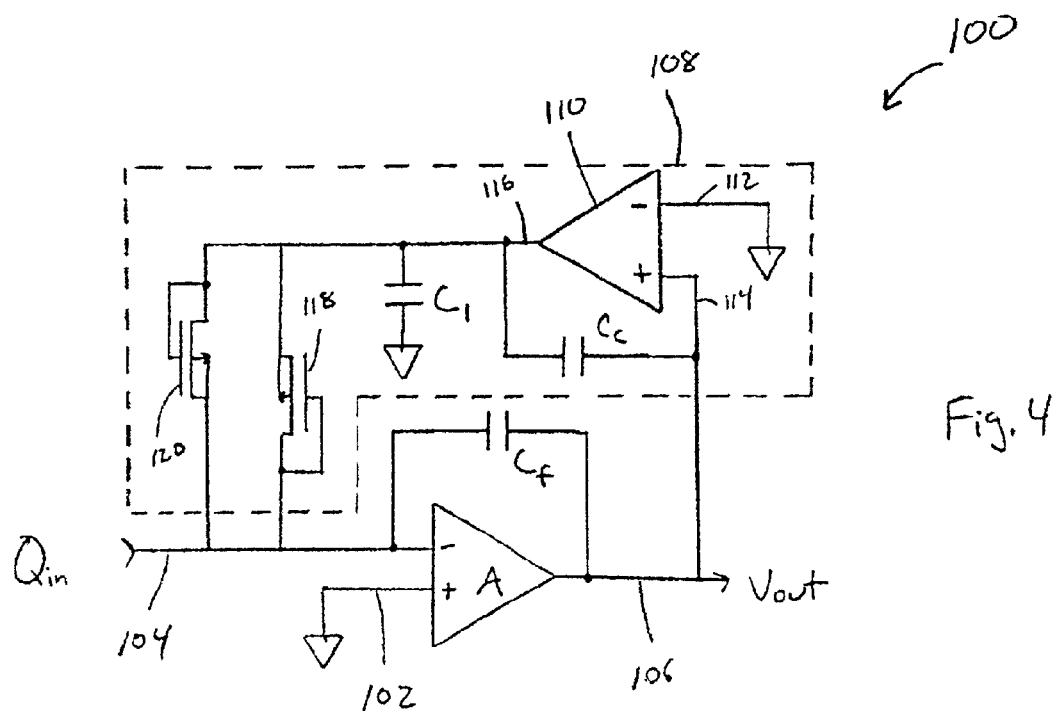
FIG. 4 is a schematic diagram of the fully integrated charge amplifier in accordance with the present invention.
Figure 1:
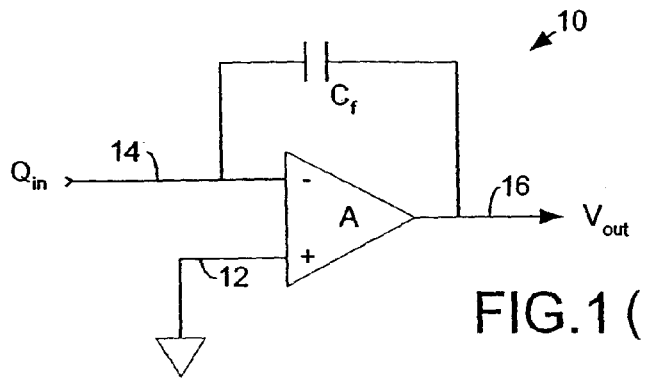
Figure 2:
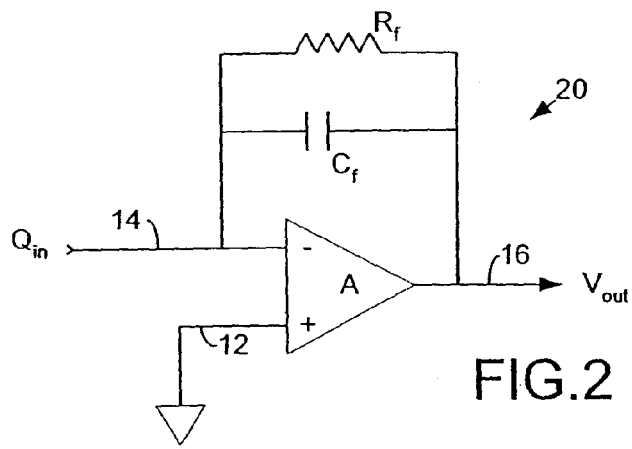
Figure 3:
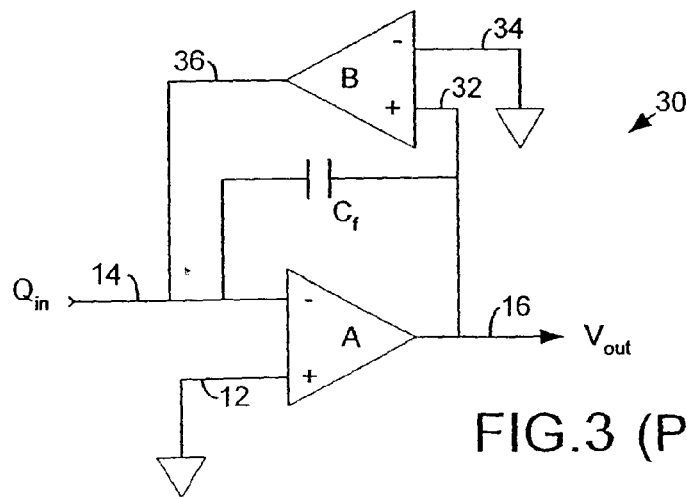
Figure 4:
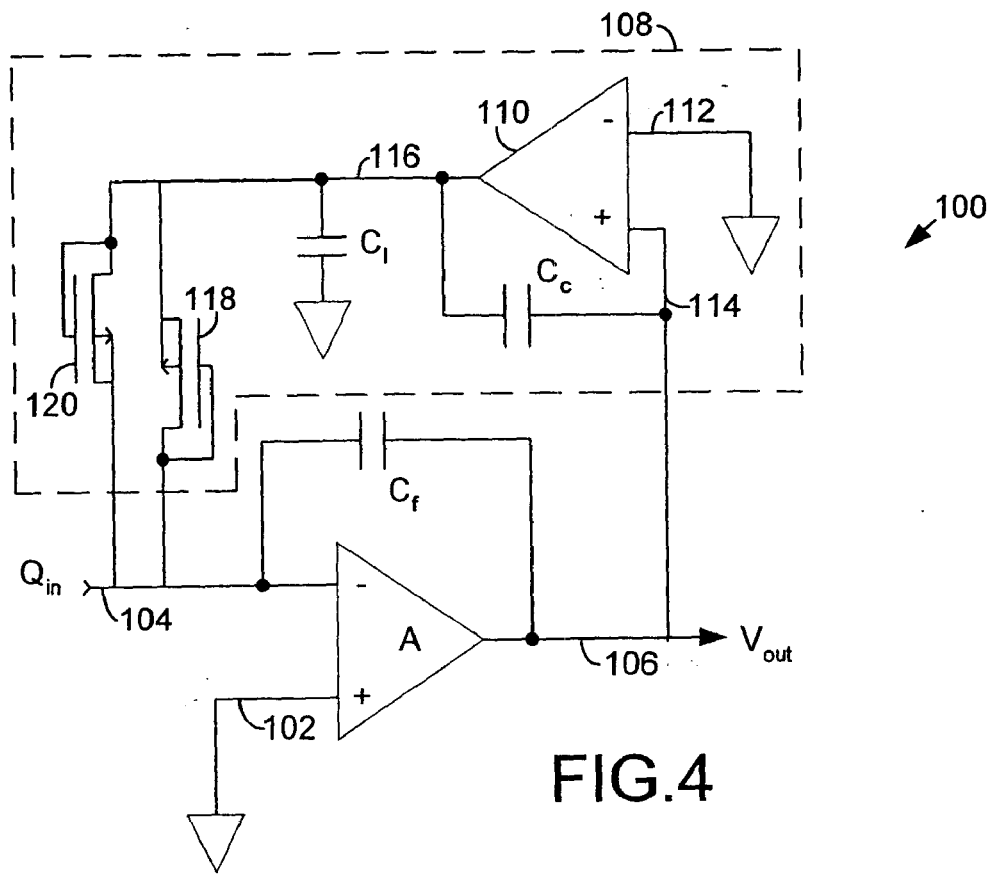

The present invention will now be described in detail with reference to FIG. 4. As shown in FIG. 4, charge amplifier 100 includes an opamp A having a non-inverting input terminal 102 connected to ground, an inverting input terminal 104 for receiving the input signal $Q_{in}$ and an output terminal 106 on which the signal $V_{out}$ is output. Charge amplifier 100 also includes a DC stabilization device 108 connected between the inverting input terminal 104 and the output terminal 106 of opamp A. DC stabilization device 108 includes an operational transimpedance amplifier (OTA) 110 having an inverting input terminal 112 connected to ground, a noninverting input terminal 114 connected to the output terminal 106 of opamp A and an output terminal 116. A feed forward capacitor $C_c$ is connected between the input terminal 114 and output terminal 116 of OTA 110 and a DC stabilization bandwidth control capacitor $C_1$ is connected between the output terminal 116 and ground. DC stabilization device 108 also includes a first p-channel MOSFET 118 configured as a diode and connected between the output terminal 116 of OTA 110 and the input terminal 104 of opamp A and a second p-channel MOSFET 120 also configured as a diode and connected between the output terminal 116 of OTA 110 and the input terminal 104 of opamp A. As shown in FIG. 4, MOSFETs 118 and 120 are connected between opamp A and OTA 110 in an oppositely biased manner. All of the components of the charge amplifier 100 may be formed as an integrated circuit on a single wafer.

Figure 1:
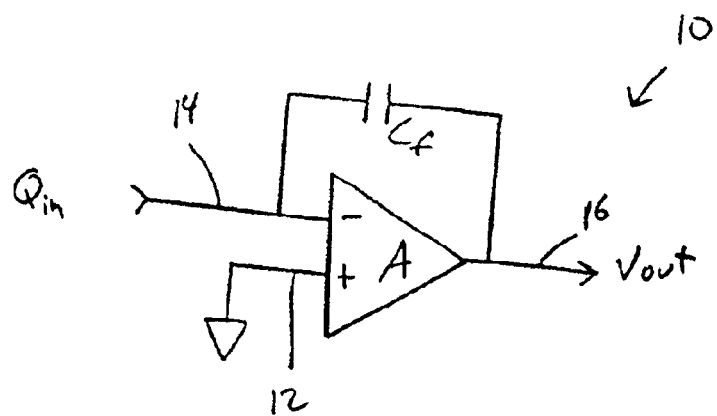
FIG. 1 is a schematic diagram of a prior art charge amplifier having no DC stabilization.
Figure 2:
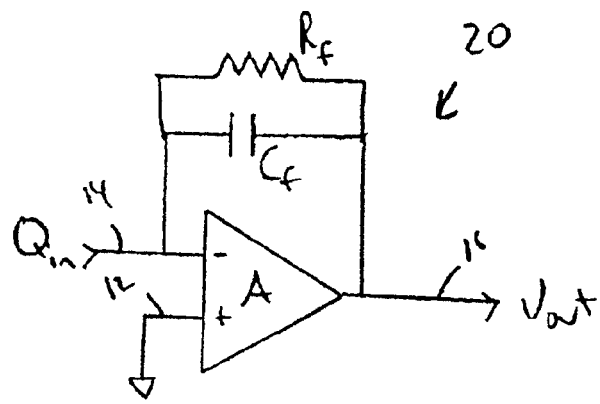
FIG. 2 is a schematic diagram of a prior art charge amplifier including an external resistor for DC stabilization.

When the charge amplifier 100 is operating above the pole frequency of $g_m/2\pi C_1$, the charge amplifier operates by providing an AC feedback path around opamp A via feedback capacitor $C_f$. This enables the charge amplifier to operate at the desired charge amplifier transfer function shown in Eq. (1). At these frequencies, the DC stabilization device 100 does not conduct substantially and the charge amplifier 100 operates in a similar manner to the ideal circuit 10 of FIG. 1.

However, below the pole frequency, the DC stabilization device 108 forms a DC feedback path through OTA 110 and diodes 118 and 120. This feedback loop provides the necessary current needed at the input terminal 104 of opamp A to cancel leakage effects at the input of opamp A. The current supplied to the input terminal 104 of opamp A is of an amplitude that causes the output $V_{out}$ of opamp A to have a DC offset equal to that of the input of OTA 110.

Capacitor $C_1$ and diodes 118 and 120 form a non-linear voltage/current divider between the OTA 110 and the opamp A which shunts noise on the output terminal 116 to ground through capacitor $C_1$, but allows stabilization current from the OTA 110 to the input terminal 104 where current leakage occurs. This enables the charge amplifier 100 to operate with lower noise and thus to have a higher signal to noise ratio than prior art charge amplifiers.

Figure 3:
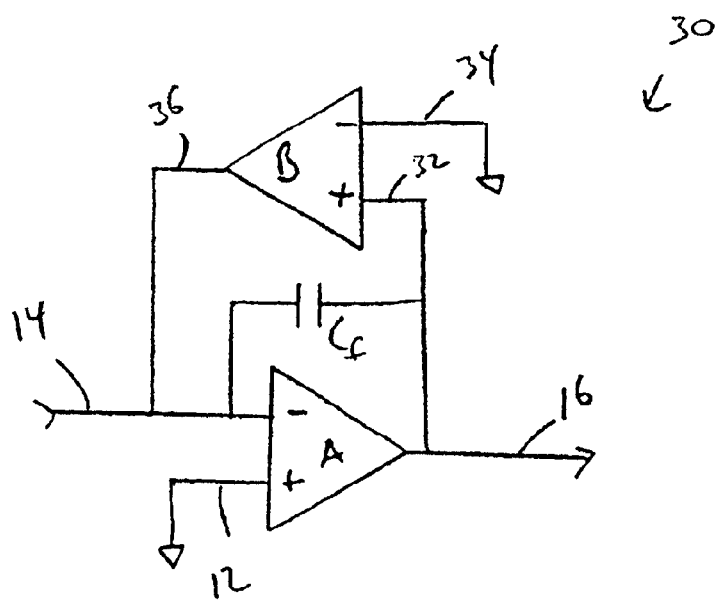
FIG. 3 is a schematic diagram of a prior art charge amplifier including an operational trans-impedance amplifier for DC stabilization.

As set forth above in the case of the prior art charge amplifier 30 in FIG. 3, the transconductance $g_m$ must be sufficiently small such that the reactance of capacitor $C_f$ will dominate at the input signal frequency. A typical transconductance of the OTA B is $\frac{1}{200}$ $\mu\Omega$. Of course, the lower the $g_m$ value of an OTA is, the more complicated and expensive the amplifier will be to manufacture. Accordingly, in the present invention, since the MOSFET diodes operate in a region where there resistance is extremely high, the transconductance $g_m$ of the OTA 110 need not be extremely low. A transconductance $g_m$ in the range of 1 to $\frac{1}{10}$ $\mu\Omega$ and preferably of approximately $\frac{1}{5}$ $\mu\Omega$ has been found to be acceptable in the charge amplifier of the present invention. Therefore, since the transconductance $g_m$ of the OTA 110 need not be as low as the transconductance of the OTA B of FIG. 3, OTA 110 is much less expensive and complicated to manufacture, thus reducing the overall cost of the charge amplifier 100. Furthermore, because the transconductance $g_m$ is higher than in the prior art OTA B, less DC input offset voltage results from the leakage that occurs at input terminal 104 of opamp A. It is important, however, that the output resistance of the OTA 110 be very high, for example greater than $(100/g_m)\Omega$, so that the transconductance is not shunted by this resistance, which would cause the input voltage offset to increase.

MOSFET diodes 118 and 120 are sized such that they provide an extremely high resistance, which is typically above approximately 1 M$\Omega$ and preferably in the range of 1–10 G$\Omega$, such that the $sC_fR$ term in the charge amplifier's transfer function, as shown in Eq. (3), is easily made much greater than 1 for relatively low input signal frequencies, typically on the order of 100 Hz, thereby approximating the transfer function of the charge amplifier of FIG. 1, as shown in Eq. (2). By enabling the charge amplifier to approximate the transfer function of Eq. (2), the high resistance formed by the diodes 118 and 120 allow the charge amplifier to process input signals at much lower frequencies than the prior art charge amplifiers.

Feed forward amplifier $C_c$, which is connected between the non-inverting input terminal 114 and the output terminal 116 of OTA 110, operates to improve the phase margin and stability of the DC stabilization device 108 by allowing phase leading current from opamp A to provide charging current to the inverting input terminal 104 of opamp A.

Accordingly, the present invention provides a charge amplifier having a DC stabilization device which is capable of processing signals in continuous time, which adds a minimal amount of noise to the charge amplifier, resulting in a higher signal to noise ratio and which has very low DC offset in the output voltage. The charge amplifier is fully integratable, resulting in smaller-sized and less expensive charge amplifiers compared to the prior art.

The invention may be embodied in other specific forms without departing from the spirit or essential characteristics thereof. For example, different types of operational amplifiers may be used to form opamp A and OTA 110, and other extremely high impedance elements, linear or non-linear, such as bipolar junction diodes may be used in place of the MOSFET diodes 118 and 120 without adversely affecting the operation of the charge amplifier. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A charge amplifier integrated circuit comprising:
    a first amplifier having an input terminal connected to an input terminal of the charge amplifier for receiving a charge and an output terminal connected to an output terminal of the charge amplifier for outputting a voltage;
    a first capacitor having a first terminal connected to said output of said first amplifier and a second terminal connected to said input of said first amplifier;
    a second amplifier having an input terminal connected to said output terminal of said first amplifier and said output terminal of said charge amplifier and having an output terminal; and,
    an impedance device, including a first diode, connected to said input terminal of said first amplifier and said output terminal of said second amplifier, said impedance device having a resistance of at least 1 M$\Omega$.

2. The integrated circuit of claim 1 wherein said impedance device further includes a second diode connected in parallel with said first diode between said input terminal of said first amplifier and said output terminal of said second amplifier.

3. The integrated circuit of claim 2 wherein said first and second diodes are oppositely biased.

4. The integrated circuit of claim 3 wherein said first diode comprises a first transistor configured as a diode and said second diode comprises a second transistor configured as a diode.

5. The integrated circuit of claim 4 wherein said first and second transistors are one of FET and bipolar transistors.

6. The integrated circuit of claim 2 further comprising a second capacitor coupled between said input terminal of said second amplifier and said output terminal of said second amplifier.

7. The integrated circuit of claim 6 further comprising a third capacitor coupled between said output terminal of said second amplifier and a ground terminal.

8. The integrated circuit of claim 1 wherein said second amplifier is a transimpedance amplifier.

9. A charge amplifier integrated circuit comprising:
    a first amplifier having an input terminal connected to an input terminal of the charge amplifier for receiving a charge and an output terminal connected to an output terminal of the charge amplifier for outputting a voltage;

a first capacitor having a first terminal connected to said output of said first amplifier and a second terminal connected to said input of said first amplifier;

a second amplifier having an input terminal connected to said output terminal of said first amplifier and said output terminal of said charge amplifier and having an output terminal; and an impedance device, including a first diode connected to said input terminal of said first amplifier and said output terminal of said second amplifier.

10. The integrated circuit of claim 9 wherein said second amplifier is a transimpedance amplifier.

11. The integrated circuit of claim 10 wherein said impedance device has a resistance of at least 1MΩ.

12. The integrated circuit of claim 11 wherein said impedance device further includes a second diode connected in parallel with said first diode between said input terminal of said first amplifier and said output terminal of said second amplifier.

13. The integrated circuit of claim 12 wherein said first and second diodes are oppositely biased.

14. The integrated circuit of claim 13 wherein said first diode comprises a first transistor configured as a diode and said second diode comprises a second transistor configured as a diode.

15. The integrated circuit of claim 14 wherein said first and second transistors are one of FET and bipolar transistors.

16. The integrated circuit of claim 9 further comprising a second capacitor coupled between said input terminal of said second amplifier and said output terminal of said second amplifier.

17. The integrated circuit of claim 16 further comprising a third capacitor coupled between said output terminal of said second amplifier and a ground terminal.

18. A charge amplifier integrated circuit comprising:

a first amplifier constructed on a chip, said first amplifier having an input terminal connected to an input terminal of the charge amplifier for receiving a charge and an output terminal connected to an output terminal of the charge amplifier for outputting a voltage;

a first capacitor constructed on said chip, said first capacitor having a first terminal connected to said output of said first amplifier and a second terminal connected to said input of said first amplifier; and a DC stabilization device, including a first diode, constructed on said chip, said DC stabilization device being connected between said input terminal of said first amplifier and said output terminal of said first amplifier and having a resistance of at least 1 MΩ.

19. The integrated circuit of claim 18 wherein said DC stabilization device includes a second amplifier and a second diode connected in parallel with said first diode, said second amplifier having an input terminal connected to said output terminal of said first amplifier and an output terminal, wherein said first and second diodes are coupled between said output terminal of said second amplifier and said input terminal of said first amplifier.

20. The integrated circuit of claim 19 wherein said first and second diodes each comprise a transistor configured as a diode.

21. The integrated circuit of claim 20 wherein said transistor that comprises each of said first and second diodes is formed from one of FET and bipolar junction transistor technology.

22. The integrated circuit of claim 21 further comprising a second capacitor coupled between said input terminal of said second amplifier and said output terminal of said second amplifier.

23. The integrated circuit of claim 22 further comprising a third capacitor coupled between said output terminal of said second amplifier and a ground terminal.

24. The integrated circuit of claim 23 wherein said second amplifier is a transimpedance amplifier.

25. A charge amplifier integrated circuit comprising:

a first amplifier having an input terminal connected to an input terminal of the charge amplifier for receiving a charge and an output terminal connected to an output terminal of the charge amplifier for outputting a voltage;

a first capacitor having a first terminal connected to said output of said first amplifier and a second terminal connected to said input of said first amplifier;

a second amplifier having an input terminal connected to said output terminal of said first amplifier and said output terminal of said charge amplifier and having an output terminal; and an impedance device connected to said input terminal of said first amplifier and said output terminal of said second amplifier, said impedance device having a resistance of at least 1 MΩ and including first and second diodes connected in parallel between said input terminal of said first amplifier and said output terminal of said second amplifier.

26. The integrated circuit of claim 25 wherein said first and second diodes are oppositely biased.

27. The integrated circuit of claim 26 wherein said first diode comprises a first transistor configured as a diode and said second diode comprises a second transistor configured as a diode.

28. The integrated circuit of claim 27 wherein said first and second transistors are one of FET and bipolar transistors.

29. The integrated circuit of claim 25 further comprising a second capacitor coupled between said input terminal of said second amplifier and said output terminal of said second amplifier.

30. The integrated circuit of claim 29 further comprising a third capacitor coupled between said output terminal of said second amplifier and a ground terminal.

31. A charge amplifier integrated circuit comprising:

a first amplifier having an input terminal connected to an input terminal of the charge amplifier for receiving a charge and an output terminal connected to an output terminal of the charge amplifier for outputting a voltage;

a first capacitor having a first terminal connected to said output of said first amplifier and a second terminal connected to said input of said first amplifier;

a second amplifier having an input terminal connected to said output terminal of said first amplifier and said output terminal of said charge amplifier and having an output terminal, wherein said second amplifier is a transimpedance amplifier; and an impedance device connected to said input terminal of said first amplifier and said output terminal of said second amplifier, wherein said impedance device has a resistance of at least 1 MΩ and includes first and second diodes connected in parallel between said input terminal of said first amplifier and said output terminal of said second amplifier.

32. The integrated circuit of claim 31 wherein said first and second diodes are oppositely biased.

33. The integrated circuit of claim 32 wherein said first diode comprises a first transistor configured as a diode and said second diode comprises a second transistor configured as a diode.

34. The integrated circuit of claim 33 wherein said first and second transistors are one of FET and bipolar transistors.

35. A charge amplifier integrated circuit comprising:

a first amplifier having an input terminal connected to an input terminal of the charge amplifier for receiving a charge and an output terminal connected to an output terminal of the charge amplifier for outputting a voltage;

a first capacitor having a first terminal connected to said output of said first amplifier and a second terminal connected to said input of said first amplifier;

a second amplifier having an input terminal connected to said output terminal of said first amplifier and said output terminal of said charge amplifier and having an output terminal;

an impedance device connected to said input terminal of said first amplifier and said output terminal of said second amplifier;

a second capacitor coupled between said input terminal of said second amplifier and said output terminal of said second amplifier; and a third transistor coupled between said output terminal of said second amplifier and a ground terminal.

36. A charge amplifier integrated circuit comprising:

a first amplifier constructed on a chip, said first amplifier having an input terminal connected to an input terminal of the charge amplifier for receiving a charge and an output terminal connected to an output terminal of the charge amplifier for outputting a voltage;

a first capacitor constructed on said chip, said first capacitor having a first terminal connected to said output of said first amplifier and a second terminal connected to said input of said first amplifier; and a DC stabilization device constructed on said chip, said DC stabilization device being connected between said input terminal of said first amplifier and said output terminal of said first amplifier and having a resistance of at least 1 MΩ, wherein said DC stabilization device includes a second amplifier and an impedance device, said second amplifier having an input terminal connected to said output terminal of said first amplifier and an output terminal, wherein said impedance device is coupled between said output terminal of said second amplifier and said input terminal of said first amplifier;

wherein said impedance device comprises a parallel connection of first and second oppositely biased diodes.

37. The integrated circuit of claim 36 wherein said first and second diodes each comprise a transistor configured as a diode.

38. The integrated circuit of claim 37 wherein said transistor that comprises each of said first and second diodes is formed from one of FET and bipolar junction transistor technology.

39. The integrated circuit of claim 38 further comprising a second capacitor coupled between said input terminal of said second amplifier and said output terminal of said second amplifier.

40. The integrated circuit of claim 39 further comprising a third capacitor coupled between said output terminal of said second amplifier and a ground terminal.

41. The integrated circuit of claim 40 wherein said second amplifier is a transimpedance amplifier.

* * * * *

UNITED STATES PATENT AND TRADEMARK OFFICE
CERTIFICATE OF CORRECTION

PATENT NO. : 6,873,206 B1
DATED : March 29, 2005
INVENTOR(S) : Hildebrant et al.

It is certified that error appears in the above-identified patent and that said Letters Patent is hereby corrected as shown below:

Drawings,
Replace Figs. 1, 2, 3 and 4 with formal drawings Figs. 1, 2, 3 and 4 attached.

Column 2,
Line 46, delete "$I_{out}=g_m[(V_{in}-)]$", and insert -- $I_{out}=g_m[(V_m+) - (V_m-)]$ --;

Column 5,
Lines 28, 34 and 35, delete "$\mu\Omega$" and insert -- $\mu$mho --;
Line 32, delete "there" and insert -- their --; and
Line 62, after "forward", delete "amplifier", and insert -- capacitor --.

Column 9,
Line 23, after "third" and before "coupled", delete "transistor", and insert -- capacitor --.

Signed and Sealed this

Thirtieth Day of May, 2006

JON W. DUDAS
*Director of the United States Patent and Trademark Office*